United States Patent [19]

Mazgy

[11] 4,400,635
[45] Aug. 23, 1983

[54] WIDE TEMPERATURE RANGE SWITCHING CIRCUIT

[75] Inventor: James D. Mazgy, Parsippany, N.J.

[73] Assignee: RCA Corporation, New York, N.Y.

[21] Appl. No.: 227,147

[22] Filed: Jan. 21, 1981

[51] Int. Cl.³ .................... H03K 19/088; H03K 19/40
[52] U.S. Cl. ..................................... 307/445; 307/254; 307/310; 307/317 A; 307/457; 307/458
[58] Field of Search ........... 307/445, 457, 458, 317 A, 307/310, 296

[56] References Cited

U.S. PATENT DOCUMENTS

| | | | |
|---|---|---|---|
| 3,217,181 | 11/1965 | Zuk | 307/446 |
| 3,417,260 | 12/1968 | Foster, Jr. | 307/457 |
| 3,428,824 | 2/1969 | Linardos et al. | 307/457 |
| 4,037,115 | 7/1977 | Lee | 307/317 A |
| 4,321,490 | 3/1982 | Bechdott | 307/458 |

Primary Examiner—Stanley D. Miller
Assistant Examiner—Davis B. P.

Attorney, Agent, or Firm—Joseph S. Tripoli; Henry I. Schanzer

[57] ABSTRACT

In a circuit in which a current is supplied to an internal node and in which transistors have their base-to-emitter junctions connected in series between the internal node and a point of reference potential, (m−1) Schottky diodes, poled to conduct current in a direction opposite to that of the "m" base-to-emitter junctions, are connected in series between the internal node and an input terminal; where m is an integer greater than 2. The (m−1) diodes compensate for the change in the base-to-emitter voltages and extend the operating range of the circuit as a function of temperature. Also, the use of two or more diodes connected in series between the input terminal and the internal node decreases the capacitance between the input terminal and the internal node, and reduces the voltage swing at the internal node necessary to turn-on and turn-off the "m" base-to-emitter junctions.

7 Claims, 5 Drawing Figures

WIDE TEMPERATURE RANGE SWITCHING CIRCUIT

This invention relates to semiconductor switching circuits and, in particular, to an improved switching circuit which is operative over a wide temperature range.

In the drawing in which like reference characters denote like components:

Figure 1:
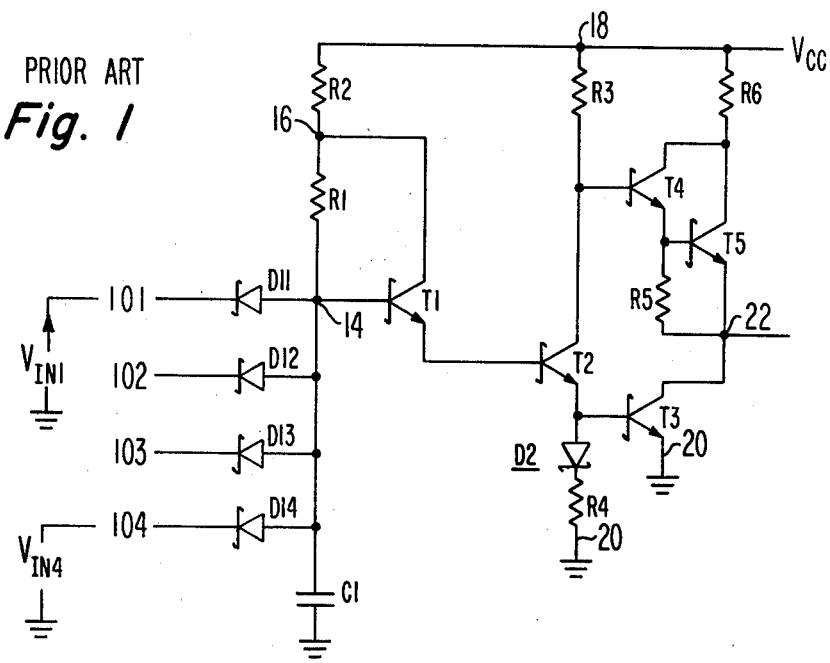
FIG. 1 is a schematic diagram of a circuit illustrating the problem faced by Applicant.

The known circuit of FIG. 1 includes signal input terminals, 10a, and respective Schottky diodes, D1i where "i" is an integer whose value may vary between 1 and 4. For ease of illustration 4 inputs ($1 \leq i \leq 4$) are shown, but evidently the circuit could have a smaller or larger number of inputs. Each diode D1i is connected between its respective input terminal 10i and a node 14 and is poled in a direction to conduct current from node 14 into its input terminal. A resistor R1 is connected between nodes 14 and 16 and a resistor R2 is connected between nodes 16 and a conductor 18 to which is applied $+V_{CC}$ volts, which is in the range of 5 volts. A transistor T1 is connected at its base to node 14, and its collector to node 16, and at its emitter to the base of a phase splitting transistor T2. T2 is connected at its collector to the base of a transistor T4 and to one end of a resistor R3. The emitter of T2 is connected to the anode of a diode D2 and to the base of a transistor T3. The cathode of diode D2 is connected to one end of a resistor R4. The other end of resistor R4 and the emitter of T3 are connected to a conductor 20 to which the applied ground potential. The collector of T3 is connected to an output terminal 22 to which is also connected one end of a resistor R5 and the emitter of a transistor T5. The base of T5 and the other end of R5 are connected to the emitter of T4 and the collectors of T4 and T5 are connected to one end of a resistor R6. The other ends of resistors R3 and R6 are connected to conductor 18.

Figure 2:
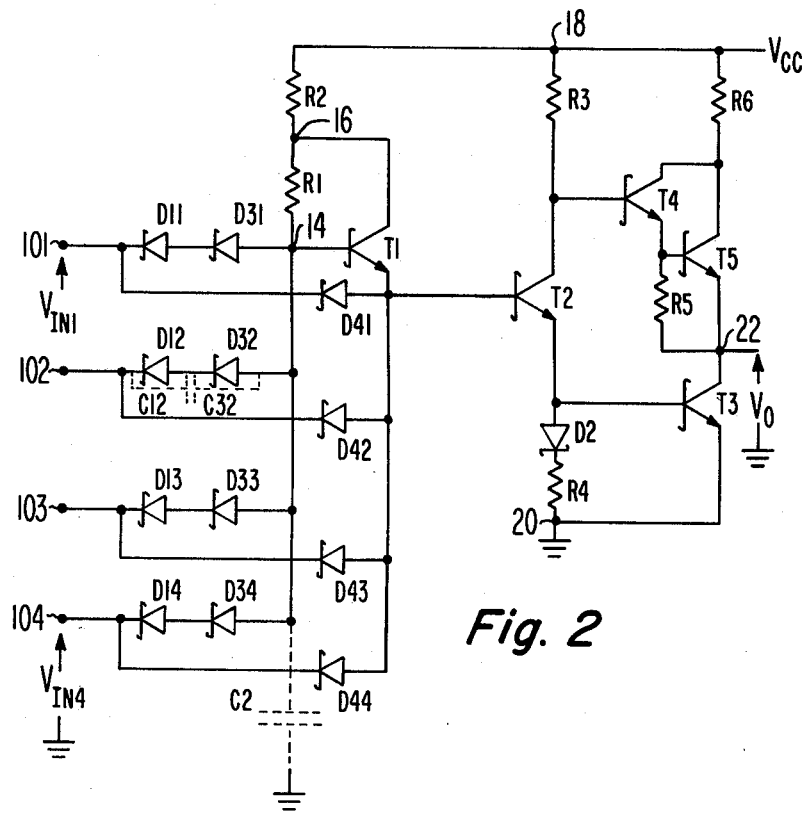
FIG. 2 is a schematic diagram of a circuit embodying the invention.

To better understand the operation of the circuits of FIGS. 1 and 2, the following definitions and assumptions are noted:

Each diode D1i, and any other Schottky diode is assumed to have a forward voltage drop ($V_{FS}$) of 0.55 volt at 25° C. and to have a temperature coefficient of $-1.2$ millivolts/°C. with increasing temperature. The forward drop ($V_F$) of a conventional diode (PN junction) and the forward base-to-emitter votage drop ($V_{BE}$) of the transistors used in the circuit are assumed to be equal to 0.8 volt at 25° C. and to have a temperature coefficient of $-2$ millivolt/°C. with increasing temperature.

A "low" input signal ($V_{IN}$), applied to a terminal 10i, is defined as a voltage between 0 volt and 0.4 volt and a "high" input signal ($V_{IN}$) has a minimum value of 2.0 volts.

In the circuit of FIG. 1 when one or more of the input signals ($V_{INi}$) is "low", the voltage (V14) at node 14 will range between $V_{FS}$ volts and [$V_{FS}+0.4$] volts above ground. When $V_{IN}$ is low, current flows from $V_{CC}$ via R2 and R1 and via the diode(s) D1i whose $V_{INi}$ is "low" into the terminal 10i. No current (except for leakage) flows into the bases of T1, T2 and T3 which are then turned-OFF. When T2 is turned-off its collector voltage goes high and current flows from terminal 18 via R3 into the bases of T4 and T5, turning them on. Then the voltage (V22) at node 22 is "High"—close to $+V_{CC}$ volts less $2V_{BE}$ volts due to conduction via R3, T4 and T5.

When all the input signals ($V_{INi}$) are "high", normally, no current flows through the D1i diodes. Instead, current flows through resistors R2 and R1 into the base of T1 and via the collector-to-emitter path of T1 into the base of transistor T2. Transistor T2 conducts and its emitter current is supplied to the base of transistor T3, driving the latter into saturation and causing the potential (V22) at its collector to be clamped close to ground potential. When T2 is ON the voltage at its collector is typically less than $2V_{BE}$ volts and T4 and T5 are turned-off. Hence, when all the $V_{IN}$ signals are high, T1, T2 and T3 conduct and the voltage (V14) at node 14 is equal to $3V_{BE}$ volts which is the sum of the base-to-emitter forward drop of T1, T2 and T3. V14 must be equal to $3V_{BE}$ volts to have conduction through T1, T2 and T3 (to thereby drive the output 22 "low") and V14 must be held below $3V_{BE}$ volts to interrupt conduction through T1, T2 and T3 (to thereby drive the output 22 "high"). The switching (or threshold) voltage at node 14 for the combination of transistors T1, T2, and T3 is then $3V_{BE}$ volts. Thus, to turn-on T1, T2 and T3 it is necessary that $V_{IN}+V_{FS}$ equal (or exceed) $3V_{BE}$ volts.

A problem exists with the circuit of FIG. 1 when it must operate over a temperature range extending from $-55°$ C. to 125° C., and where the minimum value of the "high" level of $V_{IN}$ is equal to 2 volts throughout the temperature range. The problem is best illustrated as follows. At $-55°$ C. the minimum V14 of $3V_{BE}$ volts needed to turn-on T1, T2 and T3 is equal to 2.88 volts since each $V_{BE}$ is equal to 0.96 volts at $-55°$ C. However, when a $V_{IN}-$"high" of 2 volts is applied to all of the input terminals 10i, V14 which is equal to $V_{IN}+V_{FS}$ is only equal to 2.646 volts since, at $-55°$ C., the $V_{FS}$ of a Schottky diode is 0.646 volts. 2.646 volts is clearly less than the 2.88 volts necessary to turn-on transistors T1, T2 and T3. Accordingly, for $V_{IN}$ equal to a "high" of 2 volts the logic gate cannot switch to a condition which will turn-on T1, T2, and T3 and, therefore, the circuit does not operate properly at $-55°$ C. under these conditions.

Another problem associated with the circuit of FIG. 1 is that capacitor C1, which represents all the distributed capacitance present between node 14 and ground, must be charged to $3V_{BE}$ volts are discharged to $V_{FS}$ volts for the respective "high" and "low" conditions. The time needed to charge and discharge C1 causes significant delays in the operation of the gate. Another problem with the circuit of FIG. 1 is the relatively large capacitance (C1) at node 14 due to the D1i diodes connected at their anodes to node 14. Still further, any time all four input signals concurrently are "high", V14 goes to $3V_{BE}$ and each time any input signal goes low, V14 goes from $3V_{BE}$ to $V_{FS}$, in both cases causing substantial power dissipation. Thus, in addition to the time necessary to charge and discharge capacitor C1 between $V_{FS}$ and $3V_{BE}$, substantial power dissipation is encountered.

In circuits embodying the invention, the problems discussed above are either eliminated or substantially reduced.

In a circuit embodying the invention, where a current is supplied to an internal node, and where "m" base-to-emitter junctions are connected in series between the internal node and a point of reference potential, (m−1) diodes, poled to conduct current in a direction opposite to that of the "m" base-to-emitter junctions, are connected in series between the internal node and an input terminal; where m is an integer greater than 2. The (m−1) diodes compensate for the change in the base-to-emitter voltages and function to extend the operating range of the circuit as a function of temperature. Also, the use of two or more diodes connected in series between the input terminal and the internal node decreases the capacitance between the input terminal and the internal node, and reduces the voltage swing at the internal node necessary to turn-on and turn-off the "m" base-to-emitter junctions. Hence, the power dissipation of the circuit is decreased and its speed of response is increased The invention is best explained with reference to the circuit of FIG. 2 which includes two Schottky diodes, D1i and D3i, connected in series between terminals 10i and node 14. Also, a diode, D4i, is connected between the emitter of transistor T1 and its respective input terminal 10i, for quickly discharging the emitter of T1 when the $V_{INi}$ signal goes low. The interconnections of transistors T1, T2, T3, T4 and T5 and of the other elements of the circuit of FIG. 2 are the same as in the circuit of FIG. 1 and need not be detailed anew.

It will now be demonstrated that the circuit of FIG. 2 is operable over a range of −55° C. to 125° C., is faster, and dissipates less power than the circuit of FIG. 1.

Figure 3A:
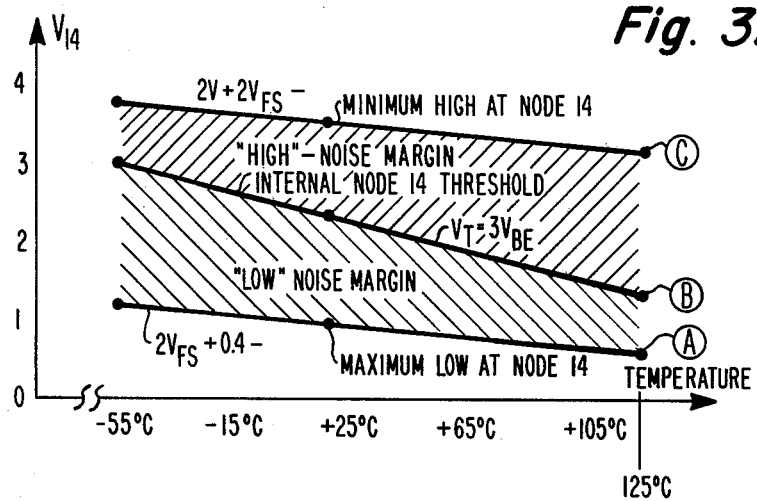
FIG. 3A is a graph illustrating the range of the voltages versus temperature at an internal node of the FIG. 2 circuit.
Figure 3B:
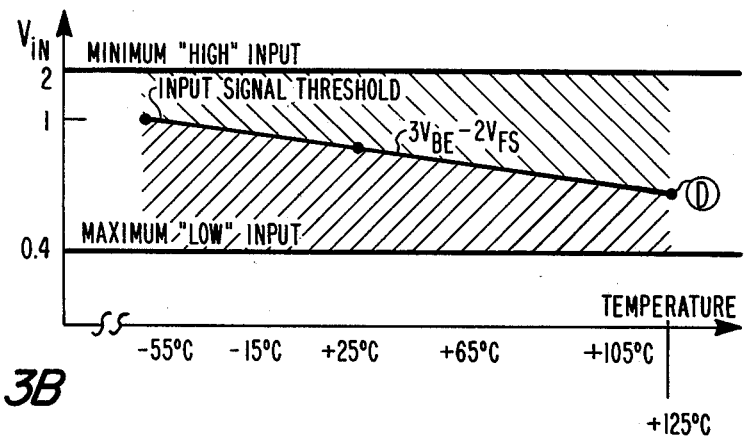
FIG. 3B is a graph illustrating a range of input signals that may be applied to an input terminal of the FIG. 2 circuit.

The switching or threshold voltage of the circuit at node 14 is still equal to $3V_{BE}$ volts (i.e. the sum of the base-to-emitter drops of T1, T2 and T3). The $3V_{BE}$ voltage varies over the temperature range of −55° C. to −125° C. as shown in graph B of FIG. 3A. When the voltage at node 14 (V14) is driven below $3V_{BE}$ transistors T1, T2 and T3 are turned-off and T4 and T5 are turned-on. When V14 can rise above $3V_{BE}$ volts (although V14 will be clamped to $3V_{BE}$ by forward conduction through the base-to-emitter of T1, T2 and T3) T1, T2 and T3 are turned-on while T4 and T5 are turned-off. Corresponding to the $3V_{BE}$ threshold at node 14 the threshold voltage of an input signal ($V_{IN}$) is equal to $[3V_{BE}−2V_{FS}]$ volts which is shown as waveform D in FIG. 3B. It is evident from FIG. 3B that the input signal threshold of $[3V_{BE}−2V_{FS}]$ volts lie between the maximum "low" input of 0.4 volt and the minimum "high" input of 2 volts, throughout the operating temperature range of −55° C. to +125° C. Therefore, a maximum "Low" of 0.4 volt and a minimum "High" of 2 volts are capable of driving the circuit inputs between high and low states. It remains to be shown that node 14 is then driven between high and low states and that the whole circuit is operational.

When a $V_{INi}$ signal is "low" (i.e. 0 to 0.4 volt) V14 goes to a "low" level equal to $2V_{FS}$ volts ($V_{FS}$ of D1i plus $V_{FS}$ of D3i) or a maximum of $[2V_{FS}+0.4]$ volts. Conventional current flows from conductor 18 through R2 and R1 into node 14 and via the forward biased D1i and D3i diodes into terminal 10i. Values of V14 in response to a maximum "low" $V_{INi}$ of 0.4 volts are listed in Table I, below, and are shown graphically in graph A of FIG. 3. Graph A represents the maximum values that V14 can have, for a "low" input signal at a terminal 10i, over the temperature range of −55° C. to +125° C. Over this temperature range it is clear that V14 is less than $3V_{BE}$ volts by a relatively large noise margin $[3V_{BE}−(2V_{FS}+0.4)]$. Therefore, throughout the temperature range, whenever a $V_{INi}$ is low, transistors T1, T2 and T3 are turned-off and transistors T4 and T5 are turned-on. Consequently, the voltage $V_O$ at output 22 will be "high"—(close to $V_{CC}$ less the $V_{BE}$ drops of T4 and T5)—over the range of −55° C. to +125° C.

When all of the $V_{INi}$ go high (to a minimum level of 2 volts) the minimum value to which V14 can rise is $[2+2V_{FS}]$ volts. That is, the minimum value of V14 could rise to a value equal to $V_{IN}$ "high" (which is equal to 2 volts) plus the forward drop across the two diodes D1i and D3i (which is equal to $2V_{FS}$). Values of V14 corresponding to the minimum $V_{IN}$—"high" of 2 volts are listed in Table I below, and are illustrated in graph C of FIG. 3 which represents the minimum values to which V14 could rise, when all of the input signals are at least 2 volts, over the temperature range of −55° C. to 125° C. Over this temperature range V14 can rise above $3V_{BE}$ volts by a relatively large noise margin $[(2+2V_{FS})−3V_{BE}]$. Therefore, throughout the temperature range of 55° C. to 125° C., when all $V_{INi}$ are "high", diodes D1i and D3i are reverse biased, current flows from terminal 18 via R2 and R1 into the bases of T1, T2 and T3 which are turned-on, while T4 and T5 are turned-off. Hence, the output node 22 will be "low"—clamped close to zero volts by T3.

Graph B of FIG. 3 which represents the switching voltage of $3V_{BE}$ volts at node 14 lies between graphs A and C throughout the temperature range of −55° C. to +125° C. Since $3V_{BE}$ volts is less positive than the minimum high value of $[2+2V_{FS}]$ volts and more positive than the maximum low of $[2V_{FS}+0.4]$ volts it is evident that the circuit is operable over the temperature range extending from −55° C. to +125° C. Thus, whenever all of the $V_{INi}$ are "high" (i.e. minimum of 2 volts) or when any of the $V_{INi}$ is low a corresponding (inverted) output signal is produced at node 22.

The use of two diodes (D1i and D3i connected in series between internal node 14 and input terminals 10i functions to raise the minimum low value of node 14 and, therefore, functions to decrease the power dissipation of the circuit. When a $V_{Ini}$ goes to a minimum "low" of 0 volt, V14 goes to a minimum low of $2V_{FS}$ volts. The idling or direct current (d.c.) flowing through R2 and R1 is then equal to $[V_{CC}−2V_{FS}]/(R1+R2)$. By comparison, in the circuit of FIG. 1, V14 goes to a low of $V_{FS}$ volts. Hence, its idling current is $[V_{CC}−V_{FS}]/[R1+R2]$ which is greater, by an amount equal to $V_{FS}/[R1+R2]$, than for the circuit of FIG. 2. Since the power dissipation is proportional to the square of the current, the power dissipation in the circuit of FIG. 2, is significantly less than that in the circuit of FIG. 1, in response to a "low" input.

The use of two diodes D1i and D3i connected in series between each input terminal 10i and node 14 reduces, significantly, the capacitance at node 14. It can be shown that, for the same number of input terminals, the capacitance C2 which represents the total capacitance at node 14 in the circuit of FIG. 2 is approximately one-half (½) the capacitance C1 at node 14 in FIG. 1.

Schottky diodes are noted for their low capacitance; but, nevertheless, when reverse biased they have a small capacitance cathode-to-anode as shown by C12 and C32 across D12 and D32 in FIG. 2. In FIG. 2, when all the $V_{INi}$ are "high" the diodes D1i and D3i are reversed biased. Then, the capacitance of each diode D1i is connected in series with the capacitance of a diode D3i between each input terminal 10i and node 14. (For ease of explanation it is assumed that each input terminal is returned to ground via a relatively low AC impedance path and that C2 represents the sum of the input network capacitance). Assuming that D1i and D3i are of similar size and construction, the capacitance due to the two diodes serially connected between each input terminal 10i and node 14 is one half the capacitance due to a single diode between the same points. Hence, capacitance C2 at node 14 is approximately one half the capacitance at node 14 when only D1i diodes are present (i.e. C2=½ C1). As further discussed below decreasing the capacitance at node 14 increases the speed of the circuit and, decreases its power dissipation still further.

Each time node 14 is switched from one binary state to the other binary state, the nodal capacitance (at node 14) is either charged or discharged. In the circuit of FIG. 2, V14 is switched between a minimum of $2V_{FS}$ volts and $3V_{BE}$ volts, while in the circuit of FIG. 1, V14 was switched between $V_{FS}$ volts and $3V_{BE}$ volts. The AC power dissipation may be expressed as $C(\Delta V)2$, where C represents the nodal capacitance, and $\Delta V$ represents the voltage change. Since the capacitance and the $\Delta V$ of the circuit of FIG. 2 is much less than that of FIG. 1, the AC power dissipation in the circuit of FIG. 2 is significantly less than that in the circuit of FIG. 1.

In the circuit of FIG. 2, V14 only has to swing between $2V_{FS}$ and $3V_{BE}$ volts to produce a change of state. This compares to the much larger swing, between $3V_{BE}$ and $V_{FS}$, through which V14 must swing in the circuit of FIG. 1. For example, the time ($t_r$) it takes the voltage at node 14 to go from the "low" state at node 14 to the $3V_{BE}$ threshold is a function of the voltage level which must be traversed and the capacitance (C) at the node. The combination of the lower voltage swing and the smaller nodal capacitance ensures that the response of the circuit of FIG. 2 is two to three times faster than that of the circuit of FIG. 1.

Figure 4:
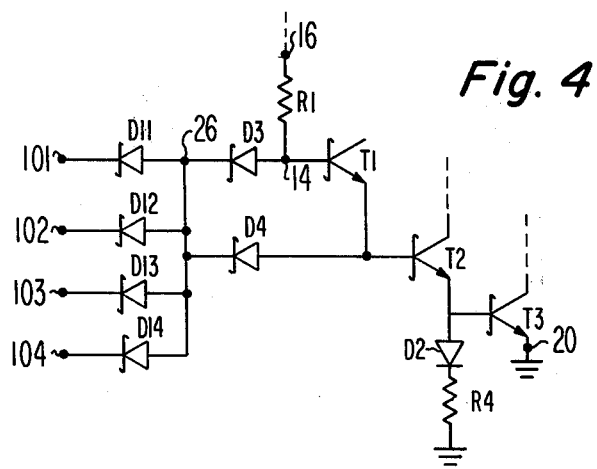
FIG. 4 is a schematic diagram of a portion of a circuit embodying the invention.

The input network of FIG. 2 may be modified as shown in FIG. 4 to decrease the total number of diodes. The circuit includes diodes D1i connected between input terminals 10i and an intermediate node 26 and a single diode D3, poled to conduct in the same direction as the D1i diodes, connected between nodes 26 and 14. The emitter of T1 is connected via a diode D4 back to node 26. D4 is poled to conduct in the same direction as the D1i diodes and functions to discharge the emitter of T1 in response to a "low" input signal. The remainder of the circuit of FIG. 4 could be identical to that shown in FIG. 2.

The steady state operation of the circuit of FIG. 4 is similar to that of FIG. 2 and need not be repeated. However, in the circuit of FIG. 4 there would be some capacitance at node 26 not found in the circuit of FIG. 2. Therefore, the circuit of FIG. 4 would be somewhat slower in speed of response than the circuit of FIG. 2.

The circuits of FIGS. 2 and 4 have been illustrated using Schottky diodes, which are noted for their very small junction capacitance and their negligible "sidewall capacitance"—(i.e. the capacitance from the depth of a junction to the semiconductor substrate. However, conventional PN junctions could be used instead of the Schottky diodes. It should be appreciated that capacitive reduction at node 14 of FIG. 2 is even more manifest in integrated circuits constructed by either dielectrically-isolated or silicon-on-sapphire processed.

TABLE I

| | | −55° C. | +25° C. | +125° C. |
|---|---|---|---|---|
| Range of V14 "LOW" | $2V_{FS}$ | 1.292v | 1.1v | 0.86 |
| | $2V_{FS} + V_{LOW}$ when $V_{LOW} = 0.4$ | 1.692 | 1.5v | 1.26 |
| Switching Threshold at node 14 = $3V_{BE}$ volts | | 2.88v | 2.4v | 1.8v |
| Range of V14 "HIGH" | $V_{IN} + 2V_{FS}$ where $V_{IN} = 2V$ | 3.292 | 3.1 | 2.86 |
| Assuming NO Clamping | $V_{IN} + 2V_{FS} + 0.4$ | 3.692 | 3.5 | 3.26 |
| Minimum Value of $V_{IN}$— "High" to Switch Logic Gate $V_{IN} = [3V_{BE} − 2V_{FS}]$ volts | | 1.588v | 1.3v | 0.94v |

What is claimed is:

1. The combination comprising:
   first and second operating voltage terminals;
   a signal input terminal;
   an internal node;
   m transistors, each transistor having a base, an emitter, and a collector; means connecting the base-to-emitter paths of said m transistors in series between said internal node and said first operating voltage terminal, all the base-to-emitter paths being poled to conduct forward current in the same direction;
   first means for conducting a current connected between said second operating voltage terminal and said internal node;
   (m−1) diodes, poled to conduct forward current in a direction opposite to the forward current flow direction in the base-to-emitter paths to said m transistors, said (m−1) diodes being connected in series between said internal node and said input terminal; where m is an integer greater than 2; and
   means coupling the collectors of said m transistors to said second operating voltage terminal.

2. The combination as claimed in claim 1 wherein m is equal to 3, and
   wherein said (m−1) diodes comprise two Schottky diodes.

3. The combination as claimed in claim 2 wherein said m transistors includes first, second, and third transistors,
   wherein said first transistor is connected at its base to said internal node and at its emitter to the base of said second transistor, and
   wherein said third transistor is connected at its base to the emitter of said second transistor and at its emitter to said first operating voltage terminal.

4. The combination as claimed in claim 3 wherein said means for conducting a current includes a first resistor connected between said internal node and said second power terminal, and wherein the combination further includes:
   a second resistor connected between the collector of said second transistor and said second power terminal, a fourth transistor connected at its base to the collector of said second transistor, means for connecting the collector of said fourth transistor to said second operating voltage terminal; and means connecting the emitter of said fourth transistor to the collector of said third transistor.

5. The combination as claimed in claim 1 further including N input terminals, where N is an integer equal to, or greater than 1, (m−1) Schottky diodes per each one of said N additional input terminals; each one of said (m−1) Schottky diodes being connected in series between its respective one of said N input terminals and said internal node.

6. The combination as claimed in claim 5 wherein said m transistors includes first, second, and third transistors, wherein said first transistor is connected at its base to said internal node and at its emitter to the base of said second transistor, and wherein said third transistor is connected at its base to the emitter of said second transistor and at its emitter to said first operating voltage terminal.

7. The combination as claimed in claim 6 wherein an additional diode is connected between each one of said input terminals and the emitter of said first transistor poled in the same direction as said Schottky diodes.

* * * * *

UNITED STATES PATENT AND TRADEMARK OFFICE
CERTIFICATE OF CORRECTION

PATENT NO. : 4,400,635

DATED : August 23, 1983

INVENTOR(S) : James D. Mazgy

It is certified that error appears in the above-identified patent and that said Letters Patent is hereby corrected as shown below:

Col. 1, line 24, change "10a" to --- 10i ---.
       line 44, change "the" to --- is ---.
Col. 3, line 25, insert a period after "increased".
       line 29, change "andnode" to --- and node ---.
       line 55, change "lie" to --- lies ---.
Col. 4, lines 33,34, change "low'-'" to --- "low" ---.
Col. 6, line 42, change "to" to --- of ---.

*Signed and Sealed this*

*Twelfth* Day of *June 1984*

[SEAL]

*Attest:*

GERALD J. MOSSINGHOFF

*Attesting Officer*     *Commissioner of Patents and Trademarks*